United States Patent
Koeppl et al.

(10) Patent No.: US 8,786,281 B2
(45) Date of Patent: Jul. 22, 2014

(54) AVOIDANCE OF SUSCEPTIBILITY ARTIFACTS IN MAGNETIC RESONANCE MEASUREMENTS VIA TARGETED ADDITION OF RECYCLED MATERIALS IN PLASTIC PARTS

(75) Inventors: Sebastian Koeppl, Petersaurach (DE); Klaus Porzelt, Nuremberg (DE); Adelbert Preissler, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 301 days.

(21) Appl. No.: 13/343,829

(22) Filed: Jan. 5, 2012

(65) Prior Publication Data
US 2013/0176025 A1    Jul. 11, 2013

(51) Int. Cl.
*G01R 33/44*     (2006.01)
*B29C 70/02*     (2006.01)
*G01R 33/565*    (2006.01)

(52) U.S. Cl.
CPC ................ *G01R 33/56536* (2013.01)
USPC ............. 324/307; 324/318; 264/241

(58) Field of Classification Search
CPC ................................. G01R 33/56536
USPC ................. 324/300–322; 264/241
See application file for complete search history.

(56) References Cited

U.S. PATENT DOCUMENTS

2009/0160439 A1*  6/2009  Fishbein ............ 324/307
2012/0249142 A1* 10/2012  Biber et al. ........ 324/309

* cited by examiner

*Primary Examiner* — Melissa Koval
*Assistant Examiner* — Rishi Patel
(74) *Attorney, Agent, or Firm* — Schiff Hardin LLP

(57) ABSTRACT

Susceptibility artifacts are significantly reduced or avoided in a magnetic resonance image by producing one or more components of a magnetic resonance system from plastic material having a targeted addition or recycled plastic material.

14 Claims, 2 Drawing Sheets

A.

B.

C.

D.

AVOIDANCE OF SUSCEPTIBILITY ARTIFACTS IN MAGNETIC RESONANCE MEASUREMENTS VIA TARGETED ADDITION OF RECYCLED MATERIALS IN PLASTIC PARTS

BACKGROUND OF THE INVENTION

1. Field of the Invention

The present invention concerns a component for a magnetic resonance system, as well as a magnetic resonance system, as well as a method for manufacturing the component, wherein susceptibility artifacts in a resulting magnetic resonance image are reduced.

2. Description of the Prior Art

In magnetic resonance (MR) measurements (data acquisitions), the homogeneity of the static, multi-Tesla basic magnetic field (referred to as the BO field) is decisive. Inhomogeneities in the magnetic field can be caused not only by the presence of metallic structures in or in the vicinity of the basic magnetic field, but also by plastic components, insofar as such plastic components have a relative permeability that deviates from 1. This deviation is known as the susceptibility $\mu_r = X_v + 1$. Such susceptibility artifacts become noticeable in anatomical MR images as errors in the spatial resolution. In functional magnetic resonance imaging (fMRI) it is necessary to superimpose an anatomical image of the subject and an fMRI image. The fMRI image is obtained by providing a sensory stimulus (sight, sound or touch) to the subject and detecting the change in blood oxygen level in the brain that occurs following the stimulus. By identifying the location or locations of such increased oxygen saturation in the brain with respect to an anatomical image of the patient's brain, the localized area within the brain in which the sensory activity occurs can be identified, and conclusions can be made as to whether this brain activity is normal or pathological. Since the change in blood oxygen level resulting from such sensory activity is extremely small, this type of magnetic resonance data acquisition is particularly sensitive to susceptibility artifacts.

In order to permit the most desirable conditions to be present in the magnetic resonance system during the acquisition of magnetic resonance data in an fMRI procedure, it is conventional to obtain the necessary anatomical image in a separate procedure that is conducted before the fMRI procedure. Typically this anatomical image is acquired by computed tomography, with the necessity of administering a relatively large quantity of contrast agent to the patient. Moreover, it is also typical to acquire this anatomical image several days before the fMRI procedure, and therefore difficulties may exist in precisely superimposing the anatomical image and the fMRI image. During the actual fMRI procedure, it is typical to make use of conventional two-dimensional digital radiography images, also requiring the administration of contrast agent, in order to monitor the procedure. Another option is to make use of trans-esophageal ultrasound (TEE).

In procedures of the type described above, as well as for other magnetic resonance data acquisition procedures, it is known to fabricate components of the magnetic resonance system from plastic in an effort to minimize the occurrence of such susceptibility artifacts. As noted above, however, even plastic material does not have a permeability that is precisely equal to 1, which is the so-called permeability of free space. As also noted above, it is this deviation from pre-space permeability that is the fundamental cause of susceptibility artifacts.

Moreover, plastic components in a magnetic resonance system must exhibit a variety of other properties in addition to a low magnetic susceptibility, and these other properties, such as insensitivity to flexural fatigue stress, biocompatibility, elasticity, appearance, workability, long-term stability, and insensitivity to environmental influences, often compete with each other as well as competing with the desire for low magnetic susceptibility.

SUMMARY OF THE INVENTION

It is an object of the present invention to provide a plastic part configured for use in magnetic resonance system, as well as a method for making such a plastic part, wherein the plastic part exhibits an extremely low magnetic susceptibility as well as affording a combination of other properties that make the component suitable for use in a magnetic resonance imaging system.

The above object is achieved in accordance with the present invention by a plastic component that has a targeted amount of recycled plastic material added thereto. Preferably the recycled material contains an amount of glass fibers that have been recycled as part of the recycling of the overall material itself.

As used herein, the term "recycled plastic material" means plastic material that has been recycled in a conventional manner by subjecting the material to one or more of grinding, melting or spraying, so as to cause not only a molecular, but also a mechanical, change in the recycled material, compared to the original (non-recycled) state of the material.

In accordance with the invention, it has been determined that the susceptibility artifacts produced by such material significantly depends on the portion of added recycled material, with an optimum being approximately a 50% addition by weight of recycled material, so that the resulting material contains approximately equal amounts of non-recycled plastic material and recycled plastic material.

In addition to the component itself as described above, the present invention also encompasses a magnetic resonance system embodying a plastic component having such a targeted addition of recycled plastic material.

The present invention also encompasses a method for reducing susceptibility artifacts in a magnetic resonance image, that includes the step of fabricating at least one plastic component with a targeted addition of recycled plastic material as described above, and embodying such a component in a magnetic resonance system at a location within the system at which the magnetic susceptibility of the component would produce, or contribute to, susceptibility artifacts in a resulting magnetic resonance image, to the extent that the permeability of the component deviates from one, and acquiring magnetic resonance data with such a magnetic resonance system and generating a magnetic resonance image from the acquired data.

The aforementioned fabricating of the at least one plastic component can be implemented by injection molding, with granulates of the non-recycled plastic material and granulates of the recycled plastic material being provided, as a mixture, to the input of an injection molder.

DESCRIPTION OF THE PREFERRED EMBODIMENTS

In accordance with the invention, it has been found that the targeted, deliberate addition of a percentage of recycled plastic material to new plastic material before the injection molding process that is implemented to form a part or component that will be used in a magnetic resonance system, significantly reduces the magnetic susceptibility of the resulting component or article. The magnetic properties of the new material and the recycled material have been found to compensate each other so that the component or part as a whole has a relative permeability of 1.

In the case of headphones that are worn by a patient during the acquisition of magnetic resonance data from the patient, it has been found that the smallest susceptibility artifacts occur with the use of Durathan BKV 30 (polyamide 6 with 30% glass fibers), but still not a susceptibility that is 0. It has been found in accordance with the invention that adding a targeted amount of recycled material, the optimum being approximately 50% by weight, reduces the magnetic susceptibility of the resulting component to 0, i.e., the component has a magnetic permeability of 1.

Polyamide 6 with and without glass fibers was tested for material selection in accordance with the invention, and for quantification of the amount of targeted material that produces the optimum results in terms of reducing susceptibility artifacts. It was initially determined that polyamide 6 with glass fibers showed markedly fewer such artifacts than polyamide 6 without glass fibers and, as noted above, the optimum amount of recycled polyamide 6 with glass fibers to be added to new polyamide 6 with glass fibers is approximately 50%.

The cause of the observed effect in reducing susceptibility artifacts is thought to be a combination of the change in molecular weight of the plastic material that occurs during the recycling process, and a mechanical change in the length of the glass fibers that also occurs as a result of the recycling process. The repeated reworking that is typical of the recycling procedure (grinding, melting and spraying) leads to a sheering of the plastic, and thus a reduction of the molecular mass, as well as a shortening of the glass fibers. The molecular mass reduction, however, generally occurs in significantly smaller dimensions than the reduction of the length of the glass fibers.

Figure 1:
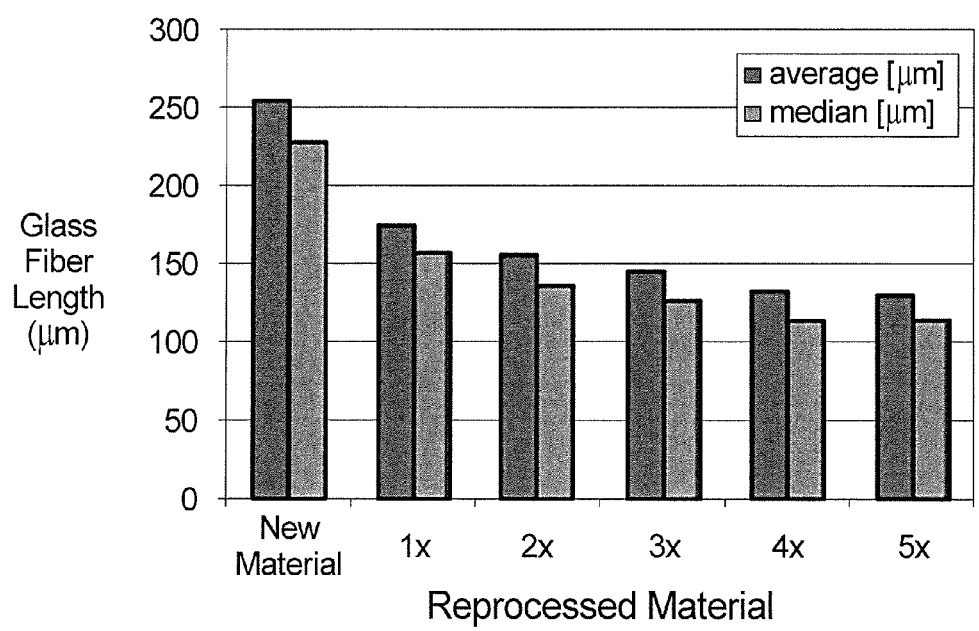
FIG. 1 is a graph showing the average and medium length of glass fibers Durathan AKV 50 (polyamide 6.6 with 50% glass fibers) resulting from successive recycling steps.

The mechanical properties (rigidity, durability, etc.) of recycled Durathan BKV 30 are therefore determined primarily by the residual glass fiber length. In each recycling step, the average value of the glass fibers is reduced further. FIG. 1 shows the average and median length of glass fibers in Durathan AKV 50 (polyamide 6.6 with 50% glass fibers) in successive recycling steps (1×, 2×, 3×, 4×, 5×).

Figure 3:
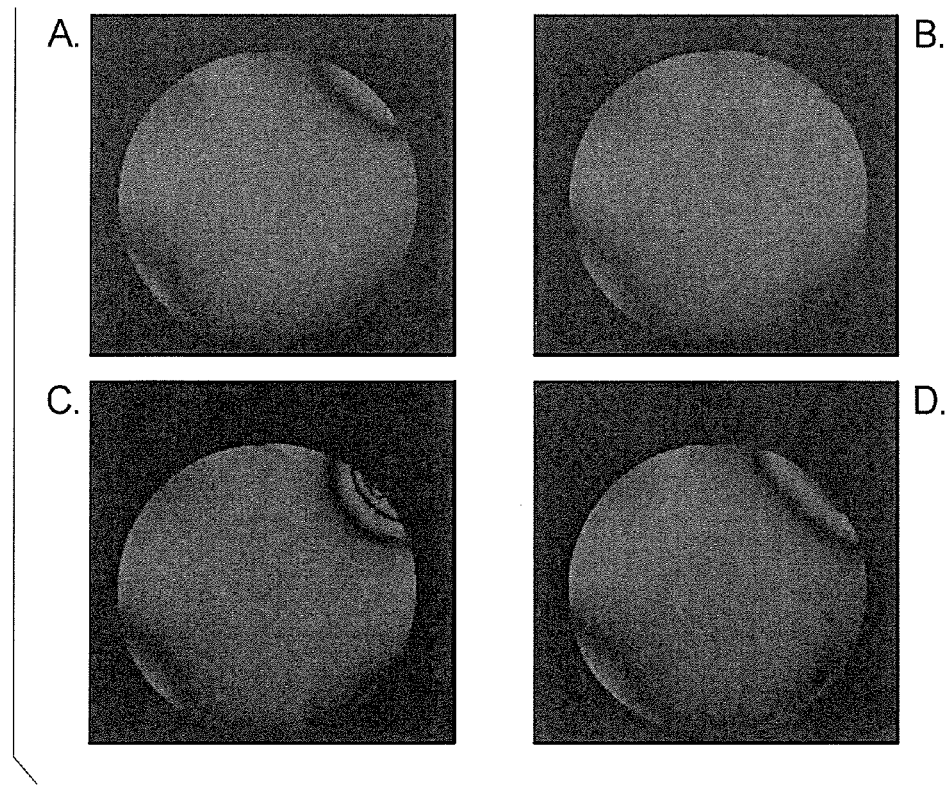
FIG. 3 shows four images of the phantom of FIG. 2, to which various types of plastic material have been added, illustrating the occurrence of susceptibility artifacts.
Figure 2:
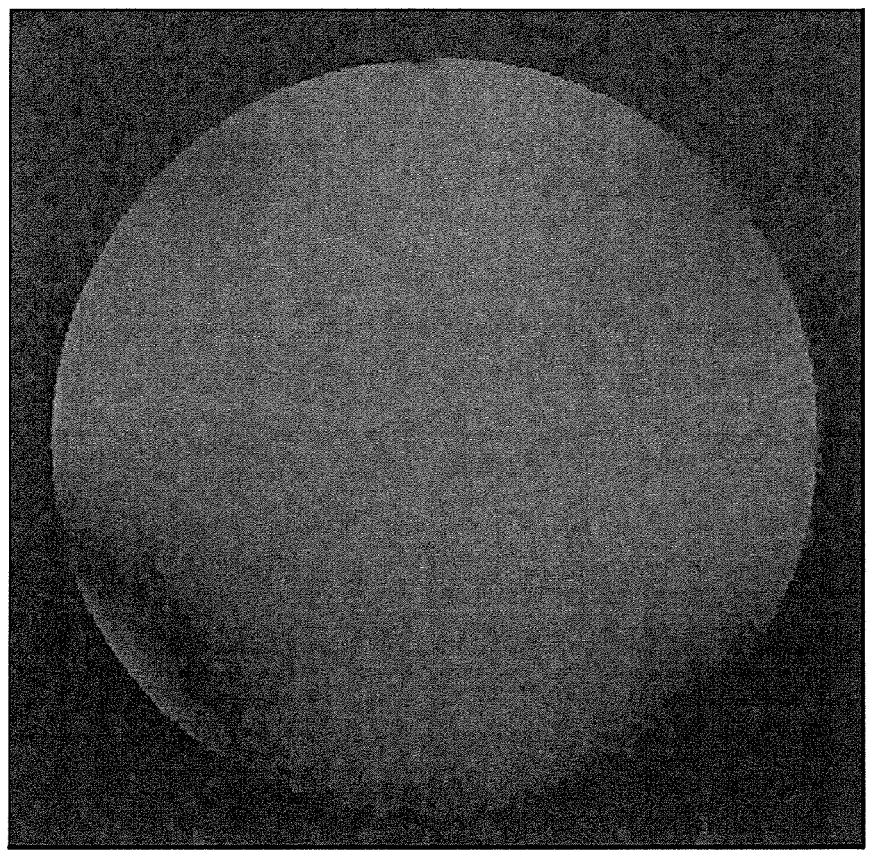
FIG. 2 is a magnetic resonance image of a phantom by itself.

FIG. 2 shows a magnetic resonance image obtained with a phantom by itself. FIG. 3 shows four images A, B, C and D with different types of plastic material added thereto. Image A shows the phantom with BKV white, with propellant, all new material. Image B shows the phantom with BKV natural, colored white, with propellant, with 50% mill (recycled) material. Image C shows BKV natural, colored white, with propellant, composed of 100% recycled material. Image D shows BKV natural, with propellant, composed of all new material.

For obtaining the images in FIG. 3, sacks of the different materials were attached to the phantom shown in FIG. 2.

As can be seen from FIG. 3, image B shows the fewest susceptibility artifacts, thereby indicating that the aforementioned mix of approximately 50% new material and 50% recycled material achieves the best results.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance-compatible component, comprising:
    a component body configured to form a part of a magnetic resonance image data acquisition apparatus in which a static, homogeneous, multi-Tesla magnetic field is generated; and
    said component body comprising a mixture of non-recycled glass fiber-containing plastic material and recycled glass fiber-containing plastic material that substantially precludes said part from producing a susceptibility artifact in an image reconstructed from magnetic resonance image data acquired with said magnetic resonance image data acquisition apparatus.

2. A component as claimed in claim 1 wherein said mixture of non-recycled glass fiber-containing plastic material and said recycled glass fiber-containing plastic material gives said component body a magnetic permeability substantially equal to 1.

3. A component as claimed in claim 1 wherein said non-recycled glass fiber-containing plastic material and said recycled glass fiber-containing plastic material are polyamide 6 with glass fibers.

4. A component as claimed in claim 1 wherein said non-recycled glass fiber-containing plastic material and said recycled glass fiber-containing plastic material are polyamide 6 with 30% glass fibers.

5. A component as claimed in claim 4 wherein said mixture comprises 50% by weight of non-recycled polyamide 6 with glass fibers and 50% by weight of recycled polyamide 6 with glass fibers.

6. A component as claimed in claim 1 wherein said mixture comprises 50% by weight of said non-recycled glass fiber-containing plastic material and 50% by weight of said recycled glass fiber-containing plastic material.

7. A magnetic resonance system comprising:
    a magnetic resonance data acquisition unit operable to acquire magnetic resonance data from a subject, said magnetic resonance data acquisition apparatus comprising a basic field magnet that generates a static, homogenous, multi-Tesla magnetic field in which the subject is located while said magnetic resonance image data are acquired from the subject;
    said magnetic resonance image data acquisition apparatus comprising a component body configured to form a part of said magnetic resonance image data acquisition apparatus; and
    said component body comprising a mixture of non-recycled glass fiber-containing plastic material and recycled glass fiber-containing plastic material that substantially precludes said part from producing a susceptibility artifact in an image reconstructed from magnetic resonance image data acquired with said magnetic resonance image data acquisition apparatus.

8. A magnetic resonance system as claimed in claim 7 wherein said mixture of non-recycled glass fiber-containing plastic material and said recycled glass fiber-containing plastic material gives said component body a magnetic permeability substantially equal to 1.

9. A magnetic resonance system as claimed in claim 8 wherein said non-recycled glass fiber-containing plastic material and said recycled glass fiber-containing plastic material are polyamide 6 with glass fibers.

10. A magnetic resonance system as claimed in claim 9 wherein said non-recycled glass fiber-containing plastic material and said recycled glass fiber-containing plastic material are polyamide 6 with 30% glass fibers.

11. A magnetic resonance system as claimed in claim 10 wherein said mixture comprises 50% by weight of non-recycled polyamide 6 with glass fibers and 50% by weight of recycled polyamide 6 with glass fibers.

12. A magnetic resonance system as claimed in claim 7 wherein said mixture comprises 50% by weight of said non-recycled glass fiber-containing plastic material and 50% by weight of said recycled glass fiber-containing plastic material.

13. A method for fabricating a magnetic resonance-compatible component, comprising:
  mixing granulates of non-recycled glass fiber-containing plastic material with granulates of recycled glass fiber-containing plastic material to form a mixture comprising approximately 50% by weight of said non-recycled glass fiber-containing plastic material and approximately 50% by weight of said recycled glass fiber-containing plastic material; and
  providing said mixture as a material input to an injection molder and, in said injection molder, producing a component body configured to form a part of a magnetic resonance image data acquisition apparatus.

14. A method for reducing susceptibility artifacts in a magnetic resonance image, comprising:
  configuring a component body to form a part of a magnetic resonance image data acquisition apparatus in which a static, homogeneous, multi-Tesla magnetic field is generated;
  forming said component body from a mixture of non-recycled glass fiber-containing plastic material and recycled glass fiber-containing plastic material that substantially precludes said part from producing a susceptibility artifact in an image reconstructed from magnetic resonance image data acquired with said magnetic resonance image data acquisition apparatus;
  operating the magnetic resonance image data acquisition apparatus to acquire magnetic resonance image data from a subject in said magnetic resonance image data acquisition apparatus; and
  in a processor, reconstructing a magnetic resonance image of the subject from the acquired magnetic resonance image data to produce a reconstructed magnetic resonance image that is substantially free of susceptibility artifacts.

* * * * *